(12) United States Patent
Rossi et al.

(10) Patent No.: US 7,787,033 B2
(45) Date of Patent: *Aug. 31, 2010

(54) APPARATUS AND METHOD FOR DETERMINING TEMPERATURE OF AN ACTIVE PIXEL IMAGER AND CORRECTING TEMPERATURE INDUCED VARIATIONS IN AN IMAGER

(75) Inventors: Giuseppe Rossi, Pasadena, CA (US); Gennadiy A. Agranov, Sunland, CA (US)

(73) Assignee: Aptina Imaging Corporation, Grand Cayman (KY)

( * ) Notice: Subject to any disclaimer, the term of this patent is extended or adjusted under 35 U.S.C. 154(b) by 1398 days.

This patent is subject to a terminal disclaimer.

(21) Appl. No.: 11/217,350

(22) Filed: Sep. 2, 2005

(65) Prior Publication Data

US 2005/0285954 A1 Dec. 29, 2005

Related U.S. Application Data

(63) Continuation of application No. 10/290,397, filed on Nov. 8, 2002, now Pat. No. 6,974,973.

(51) Int. Cl.
*H04N 9/64* (2006.01)
*H01L 31/058* (2006.01)
(52) U.S. Cl. .................. 348/244; 257/467; 257/469
(58) Field of Classification Search .......... 348/241, 348/243–5; 257/467, 469
See application file for complete search history.

(56) References Cited

U.S. PATENT DOCUMENTS

| | | |
|---|---|---|
| 4,739,495 A | 4/1988 | Levine |
| 4,862,237 A | 8/1989 | Morozumi |
| 5,008,739 A | 4/1991 | D'Luna et al. |
| 5,047,863 A | 9/1991 | Pape et al. |
| 5,452,001 A | 9/1995 | Hosier et al. |
| 5,886,353 A | 3/1999 | Spivey et al. |
| 5,929,689 A | 7/1999 | Wall |
| 5,953,060 A | 9/1999 | Dierickx |
| 6,101,287 A | 8/2000 | Corum et al. |
| 6,144,408 A | 11/2000 | MacLean |
| 6,303,923 B1 | 10/2001 | Wadsworth et al. |
| 6,330,345 B1 | 12/2001 | Russo et al. |
| 6,418,241 B1 | 7/2002 | Schreiner |
| 6,483,116 B1 | 11/2002 | Kozlowski et al. |
| 6,607,301 B1 | 8/2003 | Glukhovsky et al. |

(Continued)

OTHER PUBLICATIONS

Ralf Widenhorn, Morley M. Blouke, Alexander Weber, Armin Rest, Erik Bodegom, "Temperature dependence of dark current in a CCD", Apr. 24, 2002; Proceedings of SPIE vol. 4669 (2002) SPIE pp. 193-201.*

(Continued)

*Primary Examiner*—David L Ometz
*Assistant Examiner*—Daniel M Pasiewicz
(74) *Attorney, Agent, or Firm*—Dickstein Shapiro LLP

(57) ABSTRACT

An imager temperature sensor and a current correction apparatus are provided which use dark pixel measurements from an imager chip during operation together with a fabrication process constant as well as a chip dependent constant to calculate chip temperature. The chip temperature may be used to generate a current correction signal. The correction signal is used to tune a current on the imager chip to correct for temperature variations.

25 Claims, 9 Drawing Sheets

U.S. PATENT DOCUMENTS

| | | | |
|---|---|---|---|
| 6,974,973 | B2* | 12/2005 | Rossi et al. ............... 257/72 |
| 7,489,883 | B2* | 2/2009 | Rossi et al. ............... 399/44 |
| 2001/0011736 | A1 | 8/2001 | Dierickx |
| 2002/0098609 | A1 | 7/2002 | Ono et al. |
| 2003/0202111 | A1 | 10/2003 | Park |
| 2004/0032518 | A1 | 2/2004 | Benjamin et al. |

OTHER PUBLICATIONS

AN03: Guide to Image Quality and Pixel Correction Methods, Radicon Imaging Corp.

Anton Bakker and Johan H. Huijsing; Micropower CMOS Temperature Sensor with Digital Output, IEEE Journal of Solid-State Circuits, vol. 31, No. 7, Jul. 1996, pp. 933-937.

Karim Arabi and Bozena Kaminska, Built-In Temperature Sensors for On-line Thermal Monitoring of Microelectronic Structures, Proceedings of the 1997 International Conference on Computer Design (ICCD '97), pp. 462-467.

Louis Luh, John Choma, Jr., Jeffrey Draper, Herming Chiueh, A High-Speed CMOS On-Chip Temperature Sensor, Proceedings of the European Solid State Circuits Conference, Sep. 1999, pp. 290-293.

V. Szekely, M. Rencz and B. Courtois, Integrating On-chip Temperature Sensors into DfT Schemes and BIST Architectures, Proceedings of the 15th IEEE VLSI Test Symposium, IEEE, (1997), pp. 440-445.

M. Loose, K. Meier, J. Schemmel, Self-calibrating logarithmic CMOS image sensor with single chip camera functionality, Contribution to IEEE CCD & AIS workshop, Karuizawa, Japan (1999) R27.

Hon-Sum Wong, Technology and Device Scaling Considerations for CMOS Imagers, IEEE Transactions on Electron Devices, vol. 43, No. 12, Dec. 1996, pp. 2131-2142.

Eric R. Fossum, Digital Camera System on a Chip, IEEE Micro, May-Jun. 1998, pp. 8-15.

C. C. Lui and C. H. Mastrangelo, CMOS Uncooled Heat-Balancing Infrared Imager, IEEE Journal of Solid-State Circuits, Apr. 2000, pp. 1-9.

* cited by examiner

US 7,787,033 B2

APPARATUS AND METHOD FOR DETERMINING TEMPERATURE OF AN ACTIVE PIXEL IMAGER AND CORRECTING TEMPERATURE INDUCED VARIATIONS IN AN IMAGER

This is a continuation application of U.S. patent application Ser. No. 10/290,397, filed on Nov. 8, 2002 now U.S. Pat. No. 6,974,973, the entire disclosure of which is incorporated herein by reference.

FIELD OF THE INVENTION

The present invention relates generally to improved semiconductor imaging devices, and in particular to an imaging device employing temperature compensation.

BACKGROUND OF THE INVENTION

Imaging sensors are used to capture visible light or other types of incident radiation emissions and produce an image in a variety of applications. Many parameters of an imaging sensor are temperature dependent. It is therefore desirable to be able to determine image sensor temperature and use the temperature data in a variety of ways including compensation for the effects of temperature.

For example, in CMOS active pixel sensors (APS), overall analog power consumption is primarily the sum of the bias currents of each of the individual analog circuits. These bias currents are proportional to the master current $I_{ref}$ generated by a dedicated analog cell commonly referred to as the master current reference. In many cases, the master current reference cell has a positive thermal coefficient (PFAT) proportional to changes in absolute temperature, that is, as temperature increases, the master current increases, leading to a higher power consumption. On the other hand, as the temperature decreases, the reference current decreases leading to a reduction of the bias current for the analog circuits. With respect to its room temperature nominal value and within the temperature range of −20° C. to +65° C., it has been observed that the master current linearly varies from −15% to +15% from a nominal value. Furthermore, at room temperature the distribution of master current values in a population of CMOS chips is gaussian shaped with a standard deviation (sigma) of ~7% of the mean value. Chip-to-chip variations in master current values originate from manufacturing process variations and can typically only be corrected by individual trimming of the master current reference cell output. When process and temperature variations are combined together, temperature drift or changes cause variations of the master current $I_{ref}$ causing erroneous operation or possibly chip failure if the chip temperature changes too much.

Contemporary CMOS imager chips lack an optimal system for automatically compensating for variations in temperature in large measure because sensing of imager temperature requires dedicated circuitry which adds to design cost. Thus, a new approach is needed to provide a simplified temperature sensing system for CMOS imaging operations.

BRIEF SUMMARY OF THE INVENTION

In one aspect, the invention provides a temperature sensor, a current correction apparatus and operating method which uses dark pixel measurements from a chip during operation in combination with a known fabrication process constant and a chip dependent constant to more accurately calculate chip temperature. The chip temperature can be used to generate a temperature corrected current signal.

In another aspect of the invention, an imager chip is tested during manufacturing to determine chip dependent constants and one or more values representing a dark current scalar which are stored in an imager chip memory. The imager chip includes a pixel array with one or more dark current pixels for providing dark current signals. A logic circuit is configured to calculate a sensor temperature value based on the one or more dark current signals, the stored constants and calculated or stored scalar values. The temperature value can be used to adjust a master current source and/or individual circuit current sources on the imager chip to correct current supply for temperature variations.

The above and other features and advantages of the invention will be more readily understood from the following detailed description which is provided in connection with the accompanying drawings.

DETAILED DESCRIPTION OF THE INVENTION

The inventors have observed that a CMOS imager pixel dark current doubles every N° C. with N being a value which is process dependent and which in general ranges from 6 to 10. Dark current is that current which, under specified biasing conditions, flows in a photoconductive pixel when there is no incident radiation. Consequently, even in the absence of visible light or incident radiation dark current is present. Background radiation and thermal effects constitutes the dark current.

A variety of technical problems arise with making estimations of temperature from dark current and using such measurements for performing automatic current corrections. One difficulty is obtaining an accurate dark current measurement. Another problem is temperature calibration of the measured value of the dark current. While dark current measured from a pixel varies with temperature, there is not a direct proportional relationship between temperature and dark current. Several additional factors influence the relationship of dark current to temperature. For example, dark current relationships to temperature vary by manufacturing process. Also, the effects of temperature on dark current vary chip-to-chip.

The following equation illustrates various factors which have been found to affect a pixel dark current relationship to sensor temperature:

$$I_{dark} = I_0 e^{\alpha T} \quad (1)$$

where $I_{dark}$ is the dark current of the sensor represented by a dark current of a pixel at a temperature T, $I_0$ is a scaling factor for the dark current and $\alpha$ is a manufacturing process constant. Both constants ($I_0$ and $\alpha$) are independent of the sensor temperature T. An imager sensor temperature T can thus be derived from equation 1 as follows $$T = \frac{1}{\alpha} \ln \frac{I_{dark}}{I_0} \quad (2)$$

The constant $\alpha$ has a value which is dependent on the particular manufacturing process used to fabricate an image sensor. Experimentally, it has been found that the value of $\alpha$ does not significantly change from one pixel design to another pixel design, nor does it vary from chip to chip (or from wafer to wafer) but it is a process dependent constant.

Figure 1:
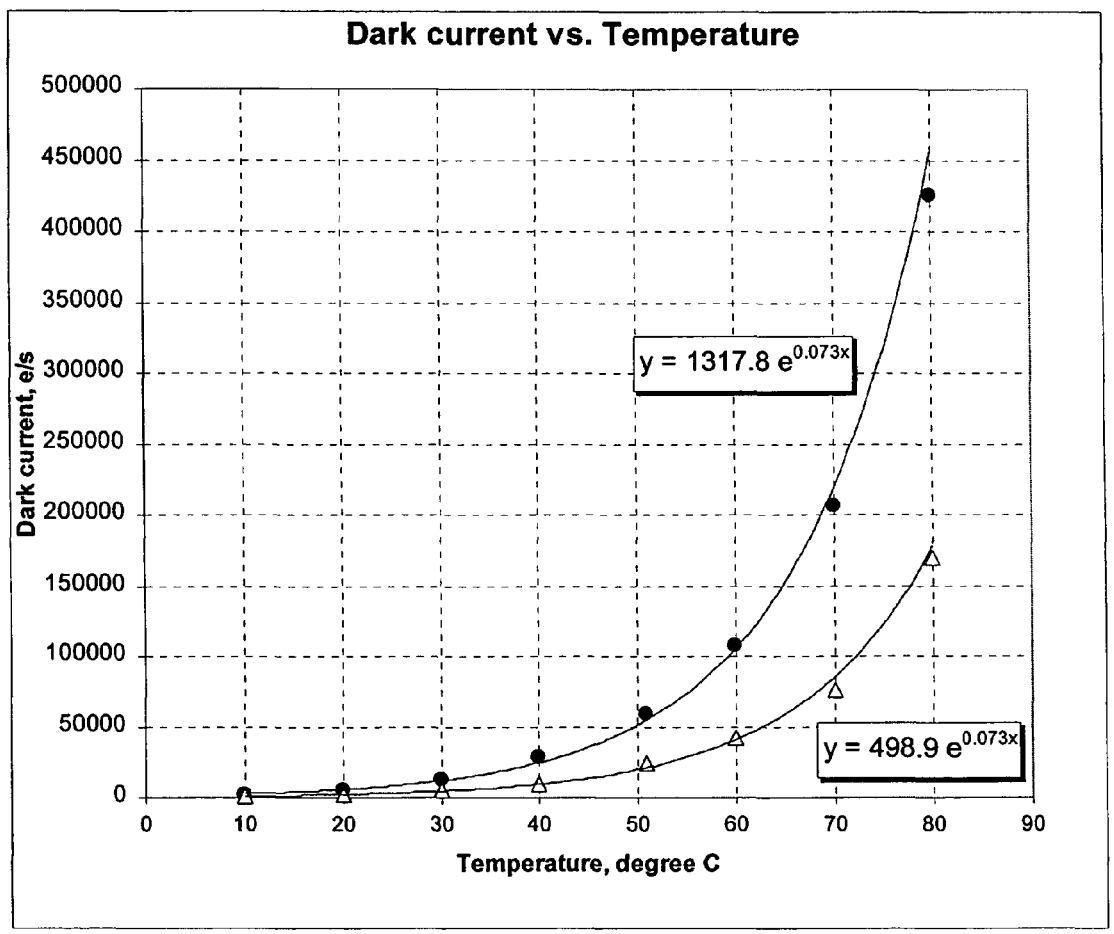
FIG. 1 shows a graph of an exponential relationship between dark current and sensor temperature.

FIG. 1 shows measured exponential relationships which exist between a pixel dark current and an image sensor temperature. The dark current versus temperature is shown as an exponential relationship with two unknowns which affect the relationship. One unknown is a and the second is the dark current scalar $I_0$ value shown in equation 1. These unknowns can be determined empirically by placing a variety of test image sensor chips made from the same manufacturing process in test equipment and then varying the ambient temperature of the sensor, and measuring a reference dark current for each reference temperature. The results can be logarithmically plotted as dark current versus temperature as shown in FIG. 2.

Figure 2:
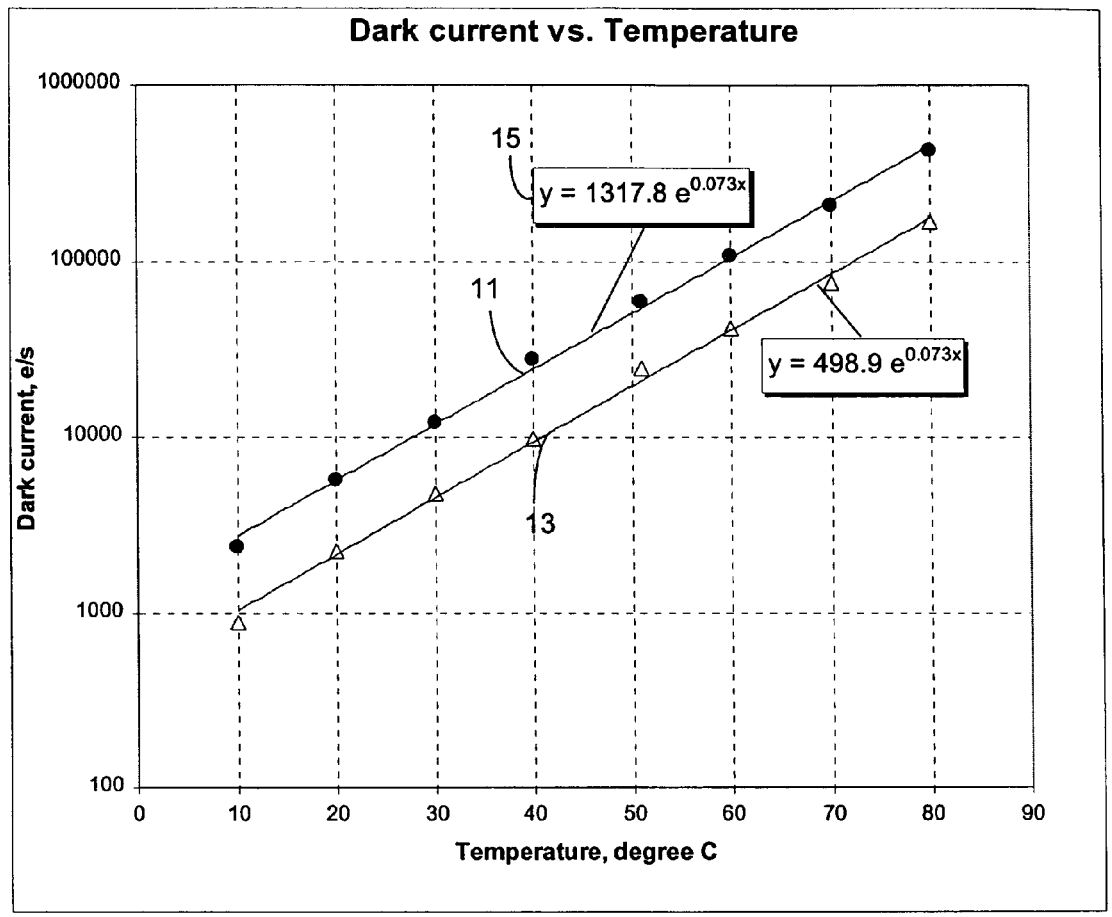
FIG. 2 shows a graph of a logarithmic relationship between dark current and sensor temperature.

The FIG. 2 logarithmic relationship between dark current and temperature is useful in determining process constant $\alpha$. FIG. 2 shows that two logarithmic plot lines 11, 13 for two different chip (pixel) designs produced by the same process have the same slope in the logarithmic representation. For the example shown in FIG. 2, the $\alpha$ constant is 0.073 for the two pixel designs. Thus, one way to determine $\alpha$ is to use the slope of a logarithmic equation describing dark current measurements at specific sensor temperatures for chips produced by the same process. A number of pixel designs can be tested to determine $\alpha$.

Equation 1 can be further explained in the context of the FIG. 2 exemplary logarithmic graph. Plot line 11 for one pixel design shows a "y" value 15 which corresponds to dark current $I_{dark}$, the plot line 11 value 1317.8 corresponds to a dark current $I_0$ scalar, the manufacturing exponential constant $\alpha$ is shown as 0.0073 and the "x" value corresponds to sensor temperature T.

Once the $\alpha$ constant is known from the slope of the FIG. 2 plot, the scalar $I_0$ can be determined. The scalar $I_0$ varies from chip-to-chip but can be determined from dark current reference values $I_{dark, ref}$ taken at a respective reference temperature $T_{ref}$ using the equation:

$$I_0 = \frac{I_{dark,ref}}{e^{\alpha T_{ref}}} \quad (3)$$

where $I_{dark, ref}$ is the measured value of dark current taken at reference temperature $T_{ref}$.

Once the values of $\alpha$ and $I_0$ are known for a particular chip, they may be stored on the chip in a memory as either the values $\alpha$ and $I_0$ or the values $\alpha$, $I_{dark\,ref}$, $T_{ref}$. In the latter case, $I_0$ is calculated when needed from the stored $I_{dark\,ref}$ and $T_{ref}$ values using equation (3) or these values can be directly used to calculate temperature. If the values $\alpha$ and $I_0$ are stored or the value $T_{ref}$ is calculated using equation 3, a sensor temperature T can be calculated from these values and a pixel dark current measurement $I_{dark}$ using equation (2). Alternatively, sensor temperature can be calculated from the stored values $\alpha$, $I_{dark\,ref}$, $T_{ref}$ and a pixel dark current measurement $I_{dark}$ from the following equation:

$$T = \frac{1}{\alpha} \ln \frac{I_{dark}}{I_{dark,ref}} + T_{ref} \quad (4)$$

In either case, a reliable measurement of sensor temperature can be produced from a pixel dark current measurement taken from a dark pixel of the sensor.

Figure 3A:
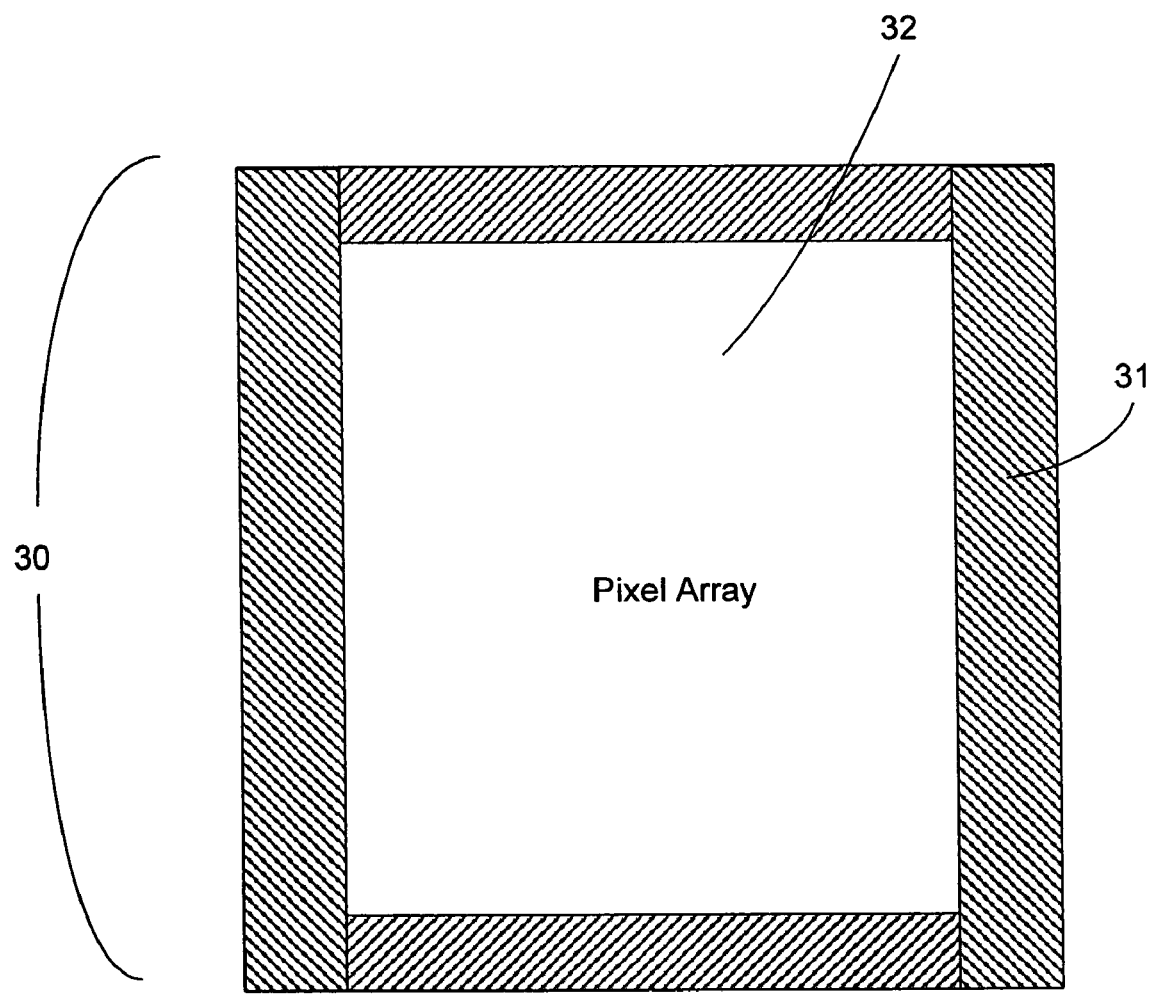
FIG. 3a shows a simplified imager pixel array with dark pixel structures.

FIG. 3a shows peripheral areas 31 of a pixel array 30 which contains dark pixels from which dark current measurements are taken. The dark pixels in peripheral areas 31 are read-out using the same signal path and timing diagram as for clear pixels in area 32 which are used for imaging.

Figure 3B:
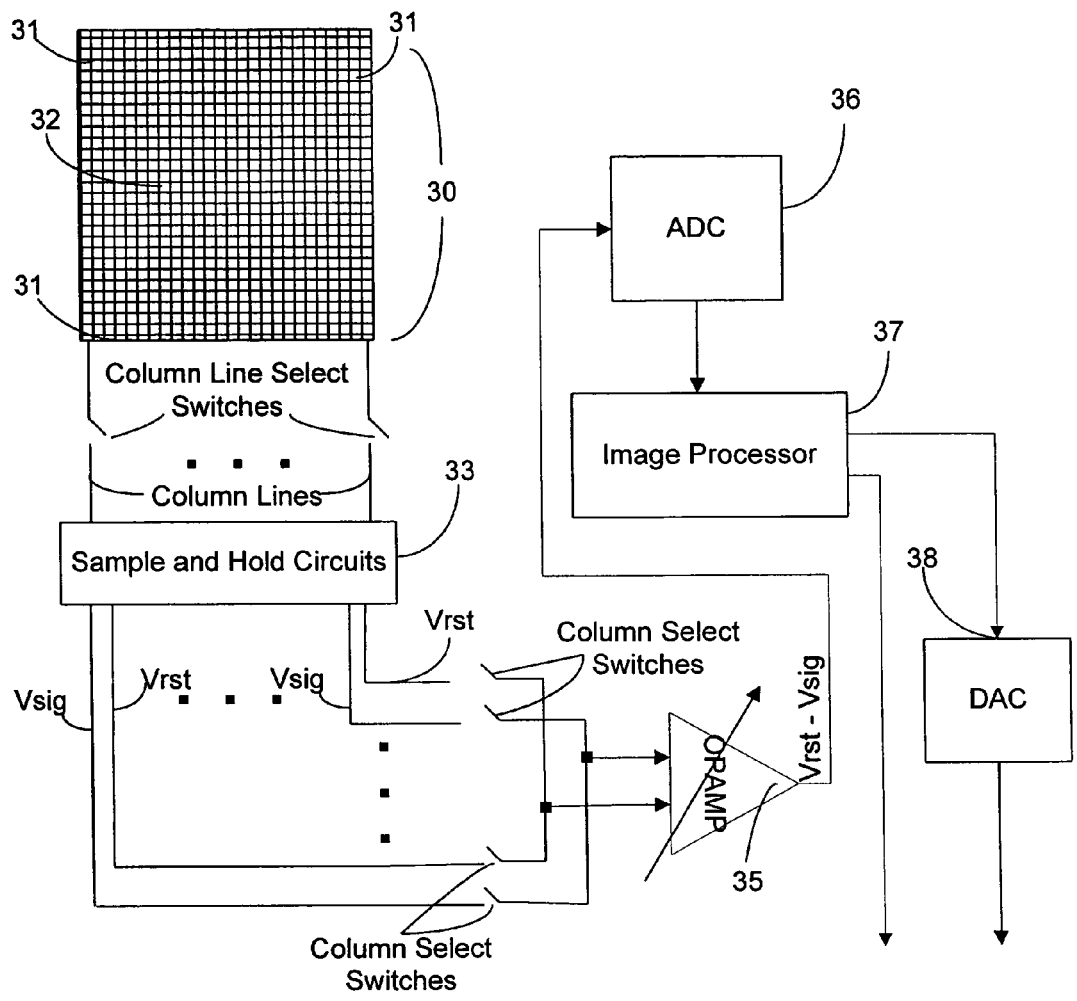
FIG. 3b shows an exemplary signal chain for an imager.

Referring to FIG. 3b, an exemplary signal path for read out of clear and dark pixels is shown. A pixel array 30 is coupled to column sample and hold circuits 33. The sample and hold circuits 33 sample pixel signals from array 30 row-by-row and column-by-column within a row as known in the art. In actual practice, each pixel whether clear or dark, provides two signals during operation, a reset signal Vrst and an image signal Vsig. These two signals are subtracted to yield an actual signal based on the pixel photo conductive process. For dark pixels, this value subtraction represents pixel dark current $I_{dark}$. As shown in FIG. 3b, the subtraction is performed in a differential amplifier 35 and the resultant signals are digitized in an analog to digital converter (ADC) 36. The digitized pixel signals are input into an image processor 37 which performs image processing on clear pixels signals and can also perform sensor temperature calculations based on the sampled dark pixel signals using the values of $\alpha$ and $I_0$ or $\alpha$, $T_{ref}$ and $I_{dark\,ref}$. The image processor 37 has two outputs in this embodiment. One output path is to a digital to analog converter (DAC) 38 and another output path carries digital data output from the image processor, including temperature data.

Figure 3C:
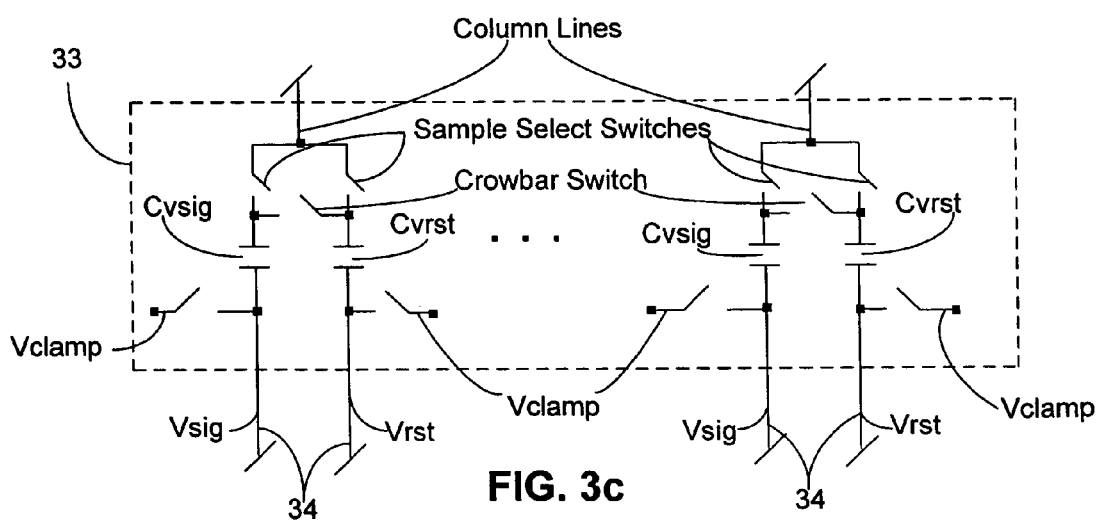
FIG. 3c shows an exemplary portion of the FIG. 3b signal chain.

FIG. 3c shows in greater detail the above mentioned sample and hold circuits 33 of FIG. 3b. In particular, FIG. 3c shows a set of sample and hold capacitors Cvrst, Cvsig selectively coupled to each column line which stores a Vrst and Vsig signals from a selected pixel. A clamping voltage Vclamp is switched to the backsides of capacitors Cvrst, Cvsig before the signals Vrst, Vsig are sampled onto the capacitor. After the signals Vrst and Vsig are sampled onto the capacitor, column and crowbar switches are used to apply the Vsig and Vrst signals sampled and stored on capacitors Cvrst, Cvsig into a differential amplifier 35.

While temperature T can be calculated from a single dark pixel of an array, an improvement in sensor temperature calculations accuracy can be obtained by calibrating the $I_{dark}$ signal through signal conditioning. It is well recognized that after amplification and digitization of the pixel signal, the converted $I_{dark}$ signal obtained from a dark pixel is composed of two components. A first component is related to the pixel current signal which, for a dark pixel, is proportional to the integrated dark current during the selected integration time. For a given integration time, this signal is temperature dependent and doubles about every 8° C. Another component is a systematic offset independent of the integration time. The offset component originates from signal conditioning procedures such as sampling, amplification and digitization and in general, is temperature dependent, although its exact dependence from temperature is not known in advance.

A large systematic offset may prevent the use of a sampled dark pixel signal $I_{dark}$ by itself to accurately determine array temperature, depending on the temperature accuracy which is required. Such an offset is removed by sampling two signals integrated by a dark pixel where each signal has different integration times, t1 and t2 to produce a calibrated dark current signal. A calibrated dark current $I_{dark}$ value with offset removed can be computed using equation 5 as follows:

$$I_{dark}=((S1+Voff)-(S2+Voff))/(t1-t2)=(S1-S2)/(t1-t2) \quad (5)$$

where S1 and S2 are the net pixel signals (Vrst−Vsig) from a dark current pixel taken for different respective integration times t1 and t2. $V_{off}$ is the offset component associated with each measurement. S1 and S2 are digitized output signals from an analog to digital converter (ADC), in this embodiment, which represent the digital value associated with uncalibrated net dark current sampling for integration times t1 and t2. A processor calculates $I_{dark}$ using S1, S2 and t1 and t2. In this way, the offset component ($V_{off}$) can be removed and a calibrated pixel dark current $I_{dark}$ value computed for use in a temperature calculation.

An automatic procedure for computing the calibrated dark current $I_{dark}$ using equation 5 can be implemented on-chip and produced as a result of computation made available at an output register of the imager. Calculation of calibrated $I_{dark}$ can be configured to be periodically executed by the imager or for instance as a part of those operations the imager routinely executes during an initialization phase. Once a dark current value $I_{dark}$ is obtained, then a sensor temperature can be computed in a processor or other logic circuit using the on-chip stored reference values using equation (2) or equation (4), as described above.

Figure 4:
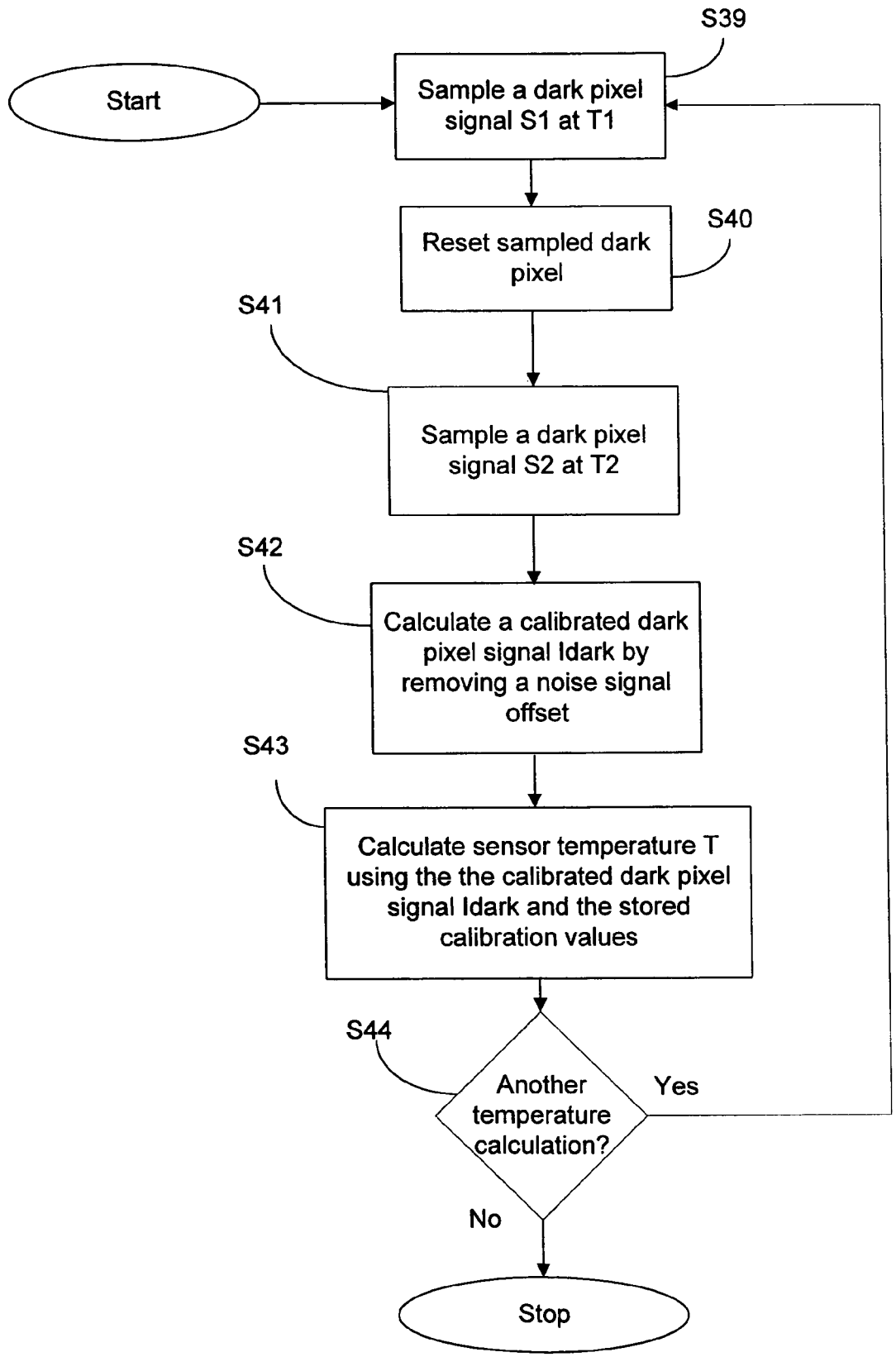
FIG. 4 shows an exemplary processing sequence for determining CMOS imager temperature.

Referring to FIG. 4, an exemplary method for performing a calculation of temperature from calibrated dark current and stored calibration values is shown. At processing segment S39, a net dark pixel signal S1 (Vrst$_1$−Vsig$_1$) is acquired using an integration time t1 from a dark pixel. The sampled dark pixel is then reset at processing segment S40. At processing segment S41, a net dark pixel signal S2 (Vrst$_2$−Vsig$_2$) is acquired for an integration time t2 from the dark pixel. One of the t1 or t2 time periods will be longer than the other time period to facilitate signal offset removal and produce a calibrated dark current signal $I_{dark}$ in accordance with equation 5. At processing segment S42, calibrated dark pixel signals $I_{dark}$ is calculated. Next, at processing segment S43, sensor temperature T is calculated in accordance with equation 2 if the values α and $I_0$ are stored or in accordance with equation 4 if the values α, $I_{dark\,ref}$ and $T_{ref}$ are stored. Next, a determination of whether or not another temperature calculation will be performed is made at processing segment S44. If yes, then processing recommences at processing segment S39. If no further temperature calculations are to be made, then processing stops. The temperature calculation can be repeated in order to obtain an average of temperature values for the same segment of the chip, or different reference dark current pixels from different segments of the chip can be averaged and used to produce a temperature measurement. It should be noted that it is not required that additional temperature calculations be performed as a single temperature value may be sufficient for a particular image processing need or requirement.

It should be noted that a highly precise temperature measurement may not be required in many applications. Moreover, it is often desirable to convert a larger bit digital value to a lower bit digital value in order to reduce processing or look-up table requirements. Thus, an estimated temperature with a desired precision can also be produced and used in accordance with the invention.

One temperature estimation technique which may be used is an estimation of variations in sensor working temperature from a reference temperature. Frequently, such an estimate will suffice for many applications. One way an estimate of a difference between actual temperature T1 and a reference temperature $T_{ref}$ can be produced is shown in equation 6:

$$T1-T_{ref}=1/\alpha*\ln(I_{dark}/I_{dark\,ref}) \quad (6)$$

Temperature estimation can also be accomplished using a temperature range corresponding to binary notation. A range scheme may be used to reduce the size of temperature values stored in an onboard register when a precise temperature value is not required.

Figure 5:
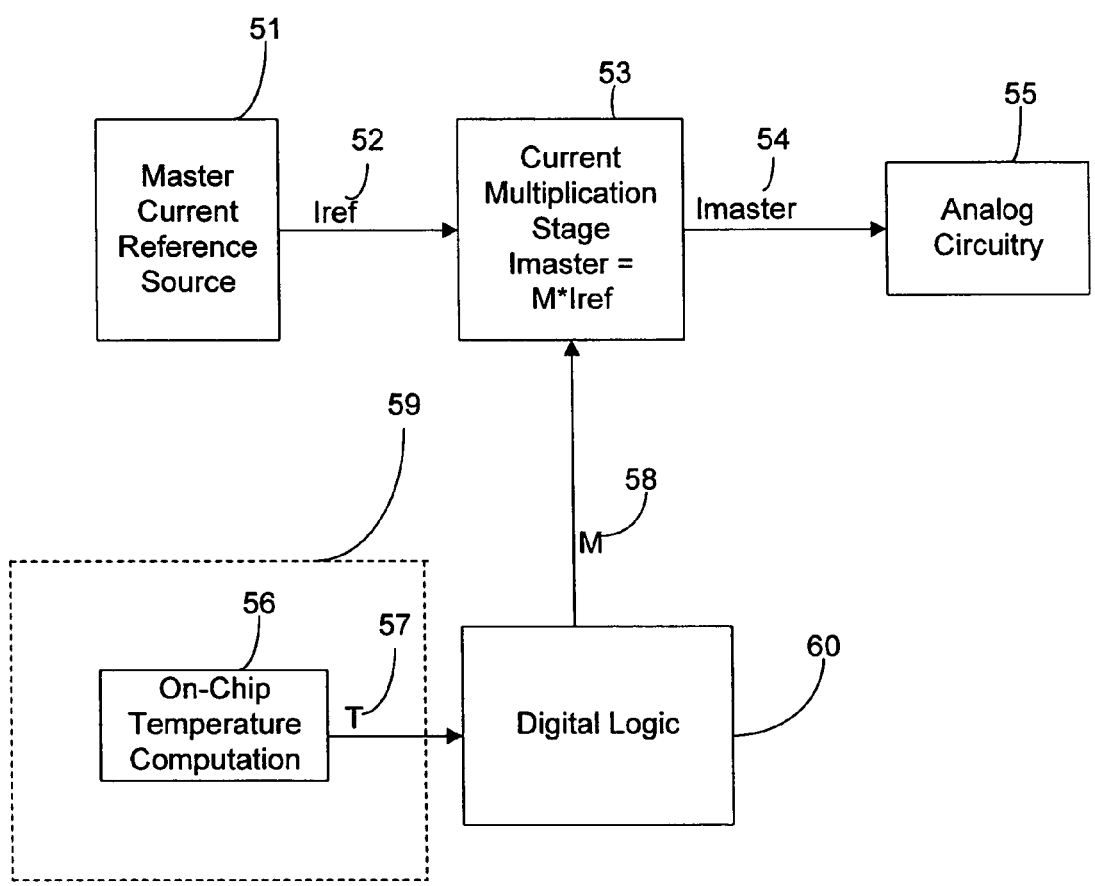
FIG. 5 shows an exemplary structure for determining an imager temperature.

Once a temperature value representing chip temperature is known, it can be used to compensate for temperature induced operational variations in an imager device. FIG. 5 shows a system for controlling the master current to an imager chip to compensate the master current for temperature variations. A chip temperature value calculated in accordance with the invention can be used to control current flow within an imager chip. A programmable current multiplication stage 53 is placed in between a master current reference source 51 and downstream analog circuitry 55 which requires current from source 51. The current multiplication stage 53 is controlled by an on-chip digital logic unit 60 which generates a scaling factor M 58 in response to a temperature data input 57. At low sensor ambient temperature, where the current reference $I_{ref}$ will be reduced with respect to its room temperature value, the multiplication constant M will be larger than unity. At high sensor ambient temperature, where the current reference will have a higher $I_{ref}$, the multiplication constant M will be less than unity. The current multiplication stage 53 generates an output current $I_{master}$ 54 by multiplication of the input $I_{ref}$ reference current with a scaling constant M 58. The actual value of scalar M 58 depends on temperature data T 57 which is provided by the calculated temperature value produced in control logic 59 using one of the temperature determining techniques described above. Note that a similar scheme could be applied for a master current reference cell with a negative thermal coefficient (NPTA) proportional to the sensor's absolute temperature provided that the multiplication constant M is decreased as the temperature increases. In other words, scaling factor M decreases if master current increases with temperature in a NPTA scheme. On the other hand, scaling factor M will increase if master current decreases. Scaling factor M may be stored in a look-up table as a function of a determined temperature value T.

Temperature compensation of the bias current can also be accomplished based on temperature measurements taken at various locations of a chip. Referring to FIG. 3b, different regions of the CMOS sensor chip are at different operating temperatures, as the power continuously dissipated on chip from the several blocks of analog electronics (analog to digital converter (ADC) 36, read-out amplifier 35, digital to analog converters (DAC) 38) is different. For example, those areas of the chip closest to the ADC analog circuitry 36 will be warmer than the read-out amplifier 35 region as the ADC 36 power dissipation is generally higher than the power dissipation of amplifier 35.

Figure 6:
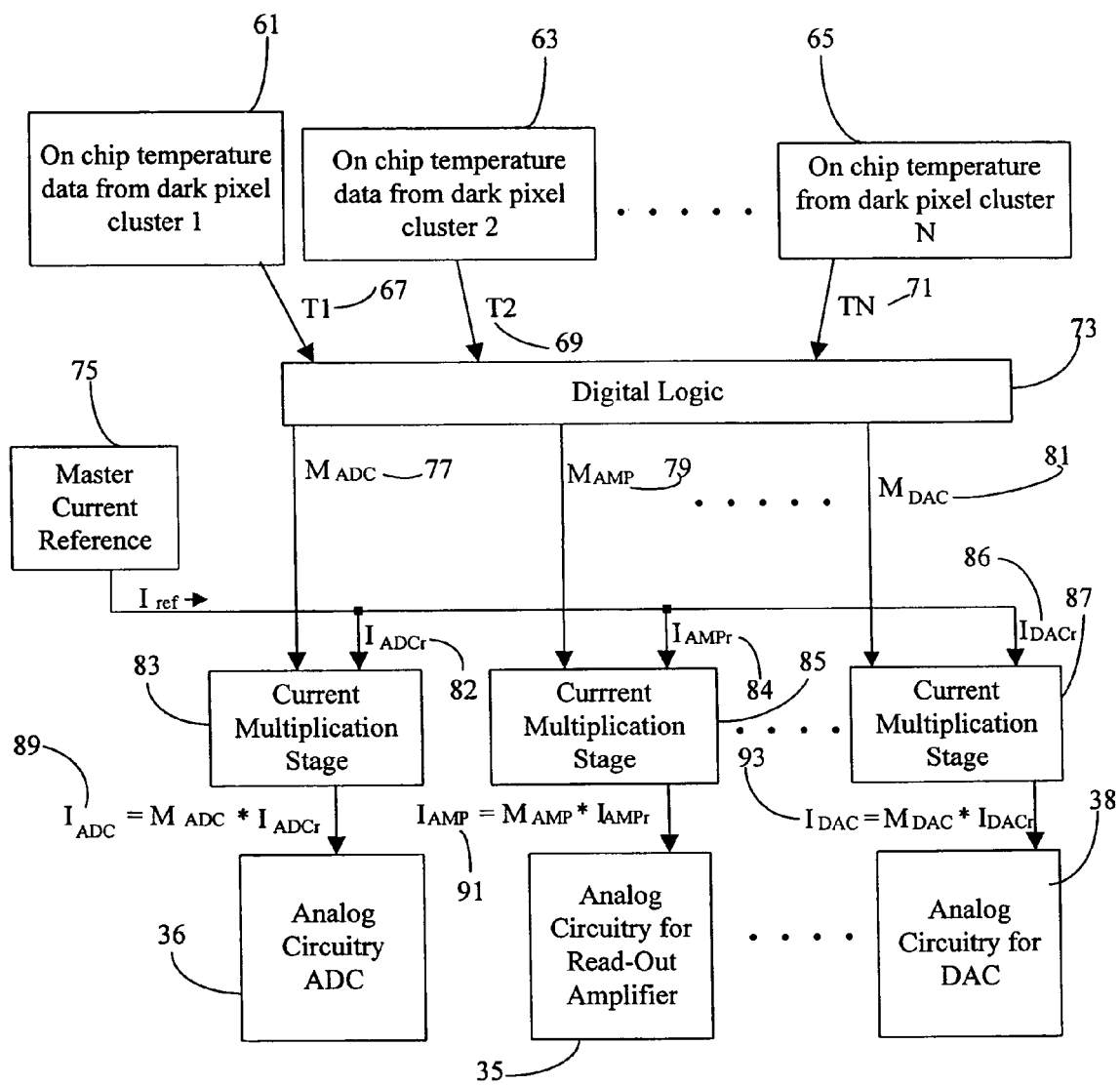
FIG. 6 shows a simplified exemplary structure for tuning a master current reference of an imager circuit.

A local correction of a bias current on a region-by-region basis can be employed by itself of or in addition to the master current control illustrated and described with reference to FIG. 5. Such a local correction will depend on the specific location of a particular block of analog electronics (ADC, read-out amplifier, or DAC) on a chip in relation to a pixel array as block temperatures will be different at different component locations on a chip. The local correction approach requires the addition of a set of current multiplication stages as shown in FIG. 6, each controlled from the digital logic unit by a specific scaling or control signal related to the temperature measurements performed by the closest dark pixel used for temperature determination. Generally, each current multiplication stage will generate a unique current reference by multiplying a reference current $I_{ADCr}$, $I_{AMPr}$, $I_{DACr}$ by a different constant M (e.g., $M_{ADC}$, $M_{AMP}$ or $M_{DAC}$) to generate a bias current I (e.g., $I_{ADC}$, $I_{AMP}$ or $I_{DAC}$), each adjusted to compensated for a different determined temperature. While these circuits, which are current consumers, have been illustrated in FIG. 6, these are only exemplary and fewer or greater numbers of current consuming circuits may be used with the invention.

Referring to FIG. 6, one embodiment of the invention can include one or more dark pixels in the vicinity of one or more components on an inager chip to calculate a local temperature for one or more components or areas on an imager chip. Thus, local temperature calculations using a localized dark current pixel for each circuit component may be used with equations (2) or (4) to produce a localized temperature compensated scaled current, e.g. $I_{ADC}$, $I_{AMP}$, $I_{DAC}$.

In addition, clusters of dark pixels in proximity to imager components can also be used to supply dark pixel signal for use in temperature calculations. The pixel clusters at each localized area can be used in connection with equation (5) to obtain the effect noted above. Also, the temperature calculations for individual or pairs of pixels in a cluster can be averaged to provide a more accurate temperature calculation. Whichever technique is used, on-chip dark current data $I_{dark}$ is processed and converted into temperature data T1 67, T2 69 and TN 71 from various dark clusters of pixels at different areas of the sensor chip (i.e., 61, 63 and 65). In this exemplary embodiment, cluster one is in the vicinity of an ADC 38, cluster two is in the vicinity of a read-out amplifier 35 and cluster N is in the vicinity of an N component, a DAC 38 in this case. The temperature data (e.g., 67, 69, 71) is input into a digital logic unit 73 which determines scaling control signals $M_{ADC}$ 77, $M_{AMP}$ 79 and $M_{DAC}$ 81.

Scaling control signals (M) can determined using one or more look-up tables which store M values that correspond to a particular calculated temperature (e.g., T2, T2 or T2) value or a range of calculated temperature values. For example, in this embodiment control signal $M_{ADC}$ 77 is determined by looking up the M value in a look-up table which corresponds to the calculated T1 value.

The look-up tables can be used to store scaling signal M values which correspond to ranges of calculated temperature values. Look-up tables which associate calculated temperature ranges with scaling signal M values can be used to reduce the number of look up table entries used to determine scaling value M for a particular calculated temperature, e.g., T1, T2 or T3.

Scaling signal $M_{ADC}$ 77 is input into a current multiplication stage 83 along with current reference $I_{ADCr}$ 82. Scaling signal $M_{AMP}$ 79 is input into a current multiplication stage 85 along with current reference $I_{AMPr}$ 85. Scaling signal $M_{DAC}$ 81 is input into another multiplication stage 87 along with current reference $I_{ref}$ 85.

Scaling signals $M_{ADC}$ 77, $M_{AMP}$ 79 and $M_{DAC}$ 81 are used in multiplication stages 83, 85, 87 to adjust the respective input reference currents $I_{ADCr}$ 82, $I_{AMPr}$ 84 and $I_{DACr}$ 86 such that the reference currents are increased or decreased in a manner indicated by the scaling signals. Current signals $I_{ADC}$ 89, $I_{AMP}$ 91, $I_{DAC}$ 93 from multiplication stages 83, 85, 87 are respectively provided to ADC 36, amplifier 35, DAC 38.

A variety of current control circuit mechanisms are possible. As noted, one embodiment of the invention can also include a master control circuit which adjusts master current based on temperature in the manner described and illustrated with respect to FIG. 5 as well as another embodiment which supplies individual currents which are adjusted based on temperature in the manner described and illustrated with respect to FIG. 6. Another embodiment can provide for a combination of the master current adjustment system of FIG. 5 and an individual current adjustment system of FIG. 6 based on various temperature calculations. Also, temperature calculations can be accomplished using a programmable processor as well as hard wired logic circuits. Calculation of temperature can be provided within the image processor or another control circuit for an imager or in a separate current control circuit for the imager.

It should be noted that any temperature dependant signal or property in an imager can be corrected using the temperature sensor system described above. For example, voltage signals or circuit impedance can be corrected using the temperature values determined using the above described system use well known voltage, impedance or other circuit correction circuits.

Figure 7A:
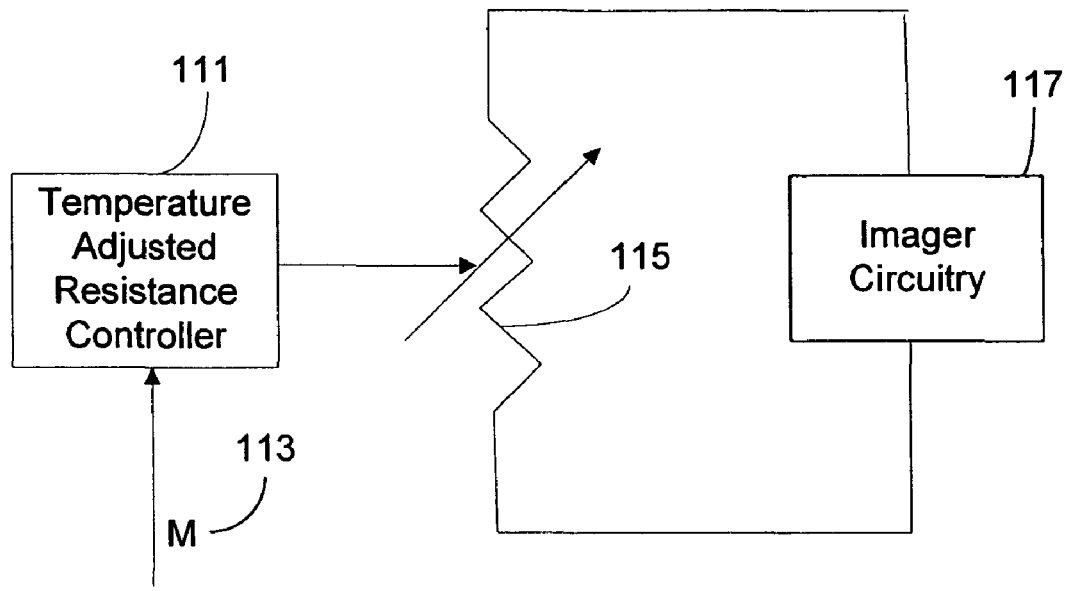
FIG. 7A shows a simplified exemplary structure for adjusting resistance of an imager circuit.

Referring to FIG. 7A, an exemplary embodiment of a circuit for adjusting resistance in one or more portions of an imager is shown. A chip temperature value calculated in accordance with the above described approaches then can be used to control resistance within an imager chip. A programmable resistance adjustment controller 111 connected to a variable resistor 115 which adjusts resistance values in imager circuitry 117. The controller 111 is controlled by an on-chip digital logic unit (not shown) which generates a scaling factor M 113 in response to a temperature data input. The actual value of scalar M 113 depends on temperature data which is provided by the calculated temperature value produced in the control logic unit using one of the temperature determining techniques described above.

Figure 7B:
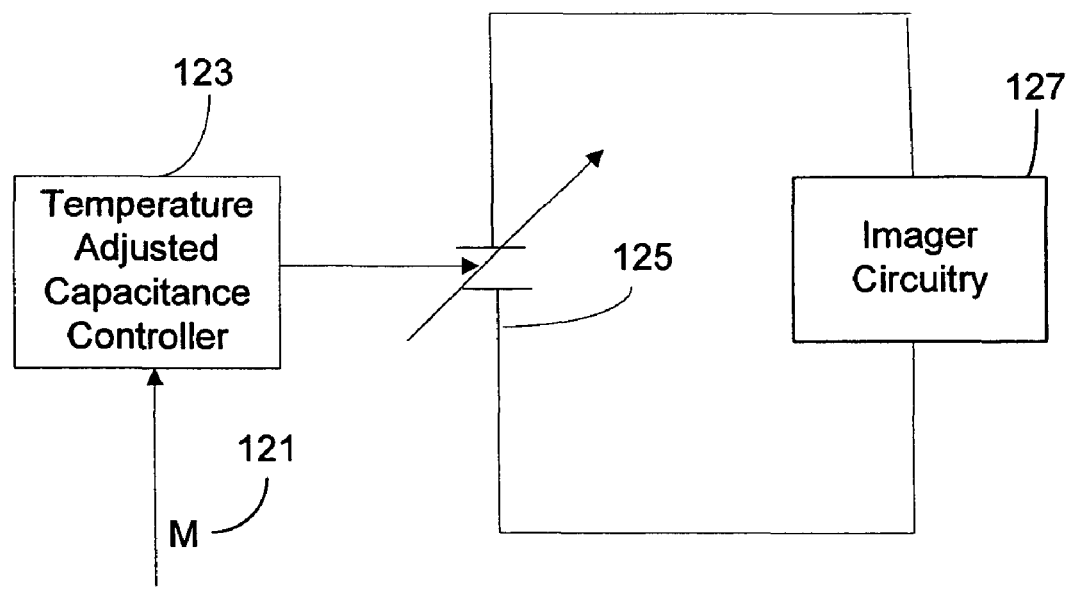
FIG. 7B shows a simplified exemplary structure for adjusting capacitance of an imager circuit.

Referring to FIG. 7B, an exemplary embodiment of a circuit for adjusting capacitance in one or more portions of an imager is shown. A programmable temperature adjusted capacitance controller 123 is connected to a variable capacitor 125 which adjusts capacitance in imager circuitry 127. The controller 123 is controlled by an on-chip digital logic unit (not shown) which generates a scaling factor M 121 in response to a temperature data input. The actual value of scalar M 121 depends on temperature data which is provided by the calculated temperature value produced in the control logic unit using one of the temperature determining techniques described above.

Figure 7C:
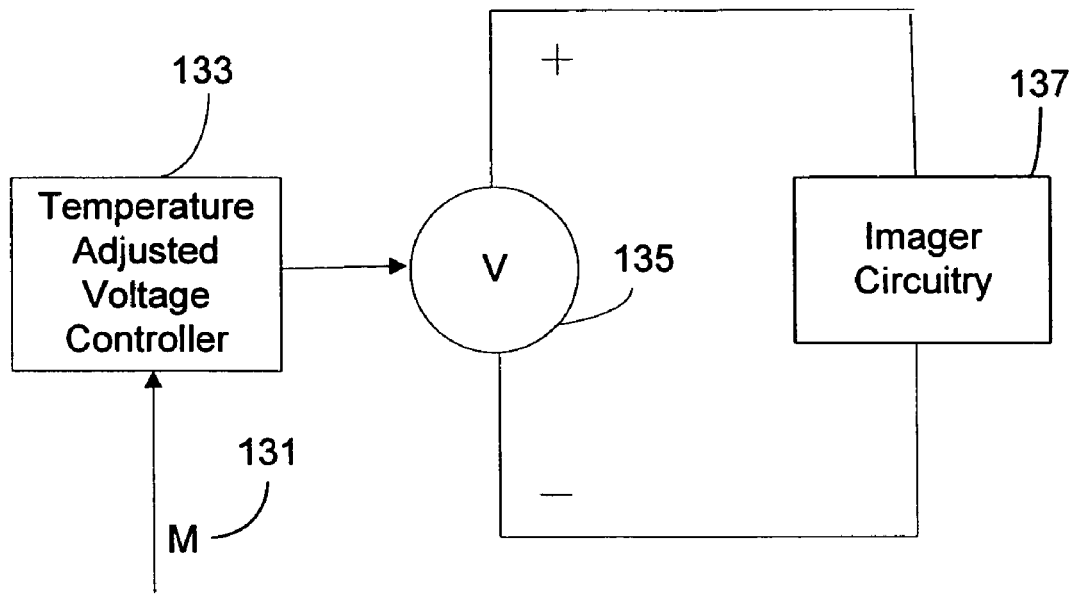
FIG. 7C shows a simplified exemplary structure for adjusting voltage of an imager circuit.

Referring to FIG. 7C, an exemplary embodiment of a circuit for adjusting voltage in one or more portions of an imager is shown. A programmable temperature adjusted voltage controller unit 133 is connected to a variable voltage source 135 which adjusts voltage in imager circuitry 137. The controller 133 is controlled by an on-chip digital logic unit (not shown) which generates a scaling factor M 131 in response to a temperature data input. The actual value of scalar M 131 depends on temperature data which is provided by the calculated temperature value produced in the control logic unit using one of the temperature determining techniques described above.

Figure 7D:
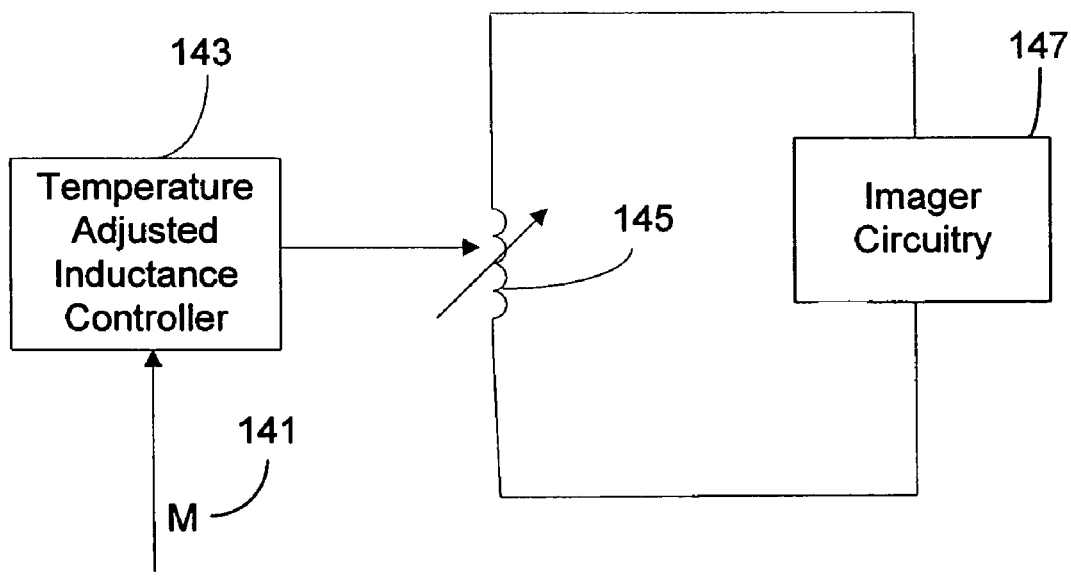
FIG. 7D shows a simplified exemplary structure for adjusting inductance of an imager circuit.

Referring to FIG. 7D, an exemplary embodiment of a circuit for adjusting inductance in one or more portions of an imager is shown. A programmable temperature adjusted inductance controller unit 143 is connected to a variable inductor 145 which adjusts inductance in imager circuitry 147. The controller 143 is controlled by an on-chip digital logic unit (not shown) which generates a scaling factor M 141 in response to a temperature data input. The actual value of scalar M 141 depends on temperature data which is provided by the calculated temperature value produced in the control logic unit using one of the temperature determining techniques described above.

It should be noted with reference to FIGS. 7A-7D that controllers 111, 123, 133, or 143 can be combined with an on-chip logic unit which performs temperature calculations. Also, one or more of circuits as in FIGS. 7A-7D can be incorporated into an imager chip in order to adjust one or more temperature dependent electrical properties such as voltage, inductance, resistance or capacitance.

While exemplary embodiments of the invention have been described and illustrated, it should be apparent that many changes and modifications can be made without departing from the spirit or scope of the invention. Accordingly, the invention is not limited by the description above, but is only limited by the scope of the appended claims.

What is claimed as new and desired to be protected by Letters Patent of the United States is:

1. An imager device comprising:
    a pixel array formed on an imaging chip and comprising at least one pixel providing a dark current signal; and
    a circuit configured to provide a representation of temperature according to said dark current signal, a fabrication process dependent parameter, and an imaging chip dependent value.

2. An imager device of claim 1 wherein said chip dependent value is a value based on a pixel reference dark current value taken at a reference temperature.

3. An imager device of claim 1 further comprising a storage device for storing said chip dependent value on said imager.

4. An imager device of claim 2 further comprising a storage device for storing said reference dark current value and said reference temperature.

5. An imager device of claim 1 further comprising a plurality of said pixels supplying dark current signals which are selectively used to provide a plurality of said temperature representations, each dark current signal being associated with at least one circuit used on said imager.

6. An imager device of claim 1 wherein said fabrication process dependent parameter is a value associated with a plurality of imaging chips produced by the same fabrication process.

7. An imager device comprising:
    a pixel array formed on an imaging chip and comprising at least one pixel providing a dark current signal; and
    a circuit configured to provide a representation of at least one of a temperature of said chip and a temperature of a portion of said chip according to said dark current signal, a fabrication process dependent parameter and an imaging chip dependent value.

8. An imager device of claim 7 further comprising a circuit for determining a correction signal based on said temperature representation.

9. An imager device of claim 8 wherein said circuit for determining said correction signal is configured to output said correction signal to a correction circuit for correcting a current of said imager.

10. An imager device of claim 7 further comprising a plurality of pixels provided at spaced locations within said array respectively supplying dark current signals, at least one pixel at each of said spaced locations providing a respective dark current signal which is associated with a respective area of said imaging chip, said circuit configured to provide a separate temperature representation for each said area according to at least a respective one of said dark current signals.

11. An imager device of claim 7 wherein said at least one pixel provides a plurality of dark current signals, at least two of said dark current signals having different integration times from which a dark current value is derived, said circuit configured to provide said temperature representation according to said derived dark current value.

12. An imager device of claim 11 wherein said derived dark current value is derived from dark current signals from more than one pixel.

13. An imager device of claim 11, wherein said circuit derives said dark current value from said plurality of dark current signals in a manner which removes common noise components present in the respective dark, current signals.

14. An imager device of claim 7 wherein said fabrication process dependent parameter is a value associated with a plurality of imaging chips produced by the same fabrication process.

15. An imager device of claim 7 wherein said chip dependent value is a value based on a pixel reference dark current value taken at a reference temperature.

16. An imager device of claim 7 further comprising a storage device for storing said chip dependent value on said imaging chip.

17. An imager device of claim 7 further comprising a storage device for storing said process dependent value on said imaging chip.

18. An imager device of claim 15 further comprising a storage device for storing said reference dark current value and said reference temperature.

19. An imager device of claim 18 wherein said storage device is provided on said imaging chip.

20. An imager device comprising:
    a pixel array comprising a plurality of pixels, said pixels comprising at least one dark pixel for providing at least one dark current signal;
    a memory which stores values comprising a process dependent value and at least one other value related to a reference dark current signal measured at a reference temperature; and
    a circuit for calculating at least one temperature value based on a sensed dark current value, said process dependent value, and said at least one other value, wherein said sensed dark current value is based on said at least one dark pixel signal.

21. An imager device of claim 20 wherein said at least one other value related to a reference dark current signal is a chip dependent value.

22. An imager device of claim 20, further comprising a plurality of dark pixels for providing dark current signals, wherein said plurality of dark current signals have more than one integration time.

23. An imager device of claim 20 wherein, said process dependent value is related to temperature dependent dark current behavior of a plurality of imager chips containing said pixel array manufactured using similar manufacturing processes.

24. An imager device of claim 20 wherein said at least one other value is a imager chip dependent value related to at least a reference dark current and reference temperature for said imager.

25. An imager device comprising:
   means for providing at least one reference pixel signal; and
   means for determining at least one temperature value for said device based on said reference pixel signal, a fabrication process value, and at least one other value related to a reference pixel signal taken from said device at a reference temperature.

* * * * *